United States Patent
Kim (12)

(10) Patent No.: US 6,358,786 B1
(45) Date of Patent: Mar. 19, 2002

(54) METHOD FOR MANUFACTURING LATERAL BIPOLAR MODE FIELD EFFECT TRANSISTOR

(75) Inventor: Seong Dong Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/591,965

(22) Filed: Jun. 12, 2000

Related U.S. Application Data

(62) Division of application No. 09/105,397, filed on Jun. 26, 1998, now Pat. No. 6,084,254.

(30) Foreign Application Priority Data

Jun. 30, 1997 (KR) .............................. 97-30392

(51) Int. Cl.$^7$ ............................................ H01L 21/337
(52) U.S. Cl. ........................ 438/189; 438/311; 438/327
(58) Field of Search .................................. 438/136, 149, 438/151, 189, 204, 311, 316, 325, 327

(56) References Cited

U.S. PATENT DOCUMENTS

| | | | |
|---|---|---|---|
| 3,855,608 A | 12/1974 | George et al. ............... 257/266 |
| 3,938,241 A | 2/1976 | George et al. ............... 438/549 |
| 4,314,267 A | * 2/1982 | Bergeron et al. ........... 438/189 |
| 5,241,211 A | 8/1993 | Tashiro ....................... 257/506 |
| 5,460,982 A | * 10/1995 | Bertagnolli et al. ........ 438/311 |
| 5,488,241 A | 1/1996 | Journeau ..................... 257/273 |
| 5,494,837 A | 2/1996 | Subramanian et al. ...... 438/151 |
| 5,510,632 A | 4/1996 | Brown et al. .................. 257/77 |

FOREIGN PATENT DOCUMENTS

KR          9724282          5/1997

* cited by examiner

Primary Examiner—Chandra Chaudhari
(74) Attorney, Agent, or Firm—Selitto, Behr & Kim

(57) ABSTRACT

A lateral bipolar field effect transistor having a drift region of a first conductivity formed on a silicon-on insulation substrate with a buried insulation layer, a gate region of a second conductivity formed over and from the buried insulation layer separated by a channel depth, in the drift region, a source region of the first conductivity contacting with the gate region and formed on the buried insulation layer, and a drain region of the first conductivity opposite to the source region, the drain region separated from the gate region by a selected distance. The gate region comprises a plurality of cells arranged parallel to an extension of the source region, each cell separated from adjacent cell by a channel width.

15 Claims, 5 Drawing Sheets

METHOD FOR MANUFACTURING LATERAL BIPOLAR MODE FIELD EFFECT TRANSISTOR

This application is a divisional of U.S. patent application Ser. No. 09/105,397 filed Jun. 26, 1998, now U.S. Pat. No. 6,084,254 issued Jul. 4, 2000.

BACKGROUND OF THE INVENTION

1. Field of the Invention

The present invention is directed to a bipolar mode field effect transistor(BMFET) technique, and more particularly to a lateral BMEFT formed on a silicon-on-insulator (SOI) substrate and a method for manufacturing the same.

2. Description of the Related Art

A BMFET, as a kind of short channel junction field effect transistor(JEFT), improves the current capability thereof through a conductivity modulation of a drift region under a forward biasing of the gate junction. The BMFET is very promising switching device for high-frequency and high-voltage applications, owing to the low forward voltage drop and the high switching speed.

FIG. 1 shows a sectional view of a vertical BMFET, separate element. On a N+ substrate 10 of a drain region is formed a N–drift region 11 of epitaxial layer. In a part of the drift region 11 are formed P+ gate regions 12 and in another part of the drift region 11 is formed N+ source region 13 surrounded by P+gate regions 12. A drain electrode 17, a gate electrode 15 and a source electrode 16 are respectively disposed on the drain region 10, the gate regions 12 and the source region 16. Between the gate electrodes 15 and the source electrode 16 are disposed insulating layers 14.

The important feature of the BMFET cell geometry is the channel width between two gate regions under N+ source region. In the normally-off BMFET, a built-in voltage of the junction between P+ gate region 15 and N– drift region 12 can deplete the channel region with width "c" and also create a potential barrier into the channel sufficiently enough to prevent a large electron emission from the source region to the drain region.

In the normally-on BMFET, the conductivity modulation of the drift region 11 with high resistivity occurs by the hole injection under the forward gate-source bias. Accordingly, very low resistance and higher current gain can be obtained.

As one method for apply the vertical BMFET having such an electrical characteristic to an integrated chip, on an epitaxial substrate the lateral BMFET is formed. However, in that case, the parasitic bipolar junction transistor(BJT) caused by the vertical P/N junction is generated and thus the power consumption is increased. Therefore, it has required that a technique which embodies a lateral BMFET suitable for the integrated chip(IC) of power device, with maintaining the electrical characteristic of the conventional vertical BMFET.

On the other hand, a SOI device, recently used widely in the power IC device, the junction capacitance between the substrate and the source/drain regions is almost not occurred because of an insulation region formed on the substrate and thus fast switching speed is possible. Also, since the leakage current into the substrate is suppressed, the SOI power IC device can used under high temperature. Accordingly, the system using SOI substrate for the power IC device has been studied, and there is, as such power IC device, a MOS gate lateral power device like LIGBT(Lateral Insulated Gate Bipolar Transistor), LMCT(Lateral MOS-Controlled Thyristor) and LDMOS (Lateral DMOS). The LDMOS has higher on-resistance than the bipolar device because of the electrons of the majority carrier, so the large power is consumed. However, the LDMOS has fast switching speed. The LIGBT or LMCT has higher current capability and lower on-resistance but the switching speed is rather low owing to the recombination of hole being a minority carrier. That is, although the vertical BMEFT has good electrical characteristic, in case where the BMFET is manufactured for IC the parasitic BJT current path is generated owing to the P/N junction. And, the MOS gate lateral power device using SOI substrate has large on-resistance or low switching speed.

SUMMARY OF THE INVENTION

Accordingly, an object of the present invention is to realize a lateral BMFET suitable for an IC.

In a view of the present invention, a lateral SOI BMFET has a substrate having an N type or P type, a buried insulation layer formed on the substrate and a drift region of the first conductivity formed on the buried insulation layer. In the drift region, a gate region of the second conductivity is disposed over and from the buried insulation layer separated by the first distance. Also, on the buried insulation layer, are disposed a source region of the first conductivity contacting with the gate region and a drain region of the first conductivity opposite to the source region, the drain region separated from the gate region by a selected distance. A source electrode, a gate electrode and a drain electrode are respectively disposed on the side of the source region, on the gate region and the on the drain region. The gate region comprises a plurality of cells arranged parallel to an extension of the source region, each cell separated from adjacent cell by a second distance. Here, the first distance is a channel depth and the second distance is a channel width. The first conductivity is N type and the second conductivity is P type.

In another view of the present invention, a buried insulation layer is formed on a substrate with P type or N type. A drift region of the first conductivity is formed on the buried insulation layer and a trench is made at a part of the buried insulation layer, exposing the buried insulation layer. Then, a gate region of the second conductivity is formed separately from the buried insulation layer by a first distance, at a portion separated from the trench among the drift region. A source region of the first conductivity is formed between the gate region and the trench and at the same time a drain region of the first conductivity opposite to the source region is formed separately from the gate region by a selected distance. The gate region comprises a plurality of cells arranged parallel to an extension of the source region, each cell separated from adjacent cell by a second distance. Here, the first distance is a channel depth and the second distance is a channel width. The first conductivity is N type and the second conductivity is P type. Also, after forming the drain region, an insulation layer is formed on the resultant in which the source region and the drain region are formed and then the insulation layer in the trench and on the gate region and the drain region is removed. Thereafter, the trench is filled with metal, forming a source electrode, and a gate electrode and a drain electrode are formed on the gate region and the drain region.

DESCRIPTION OF THE PRESENT INVENTION

Figure 1:
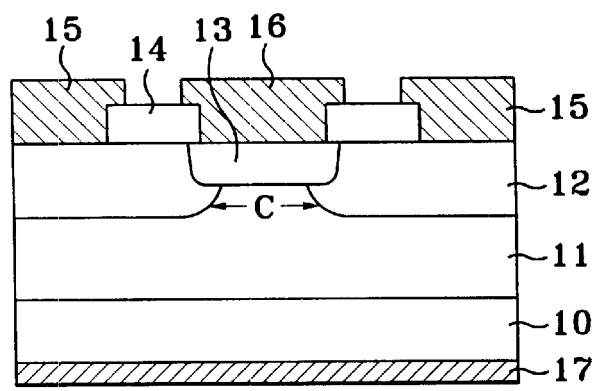
FIG. 1 shows a cross-section of a vertical BMFET.
Figure 2:
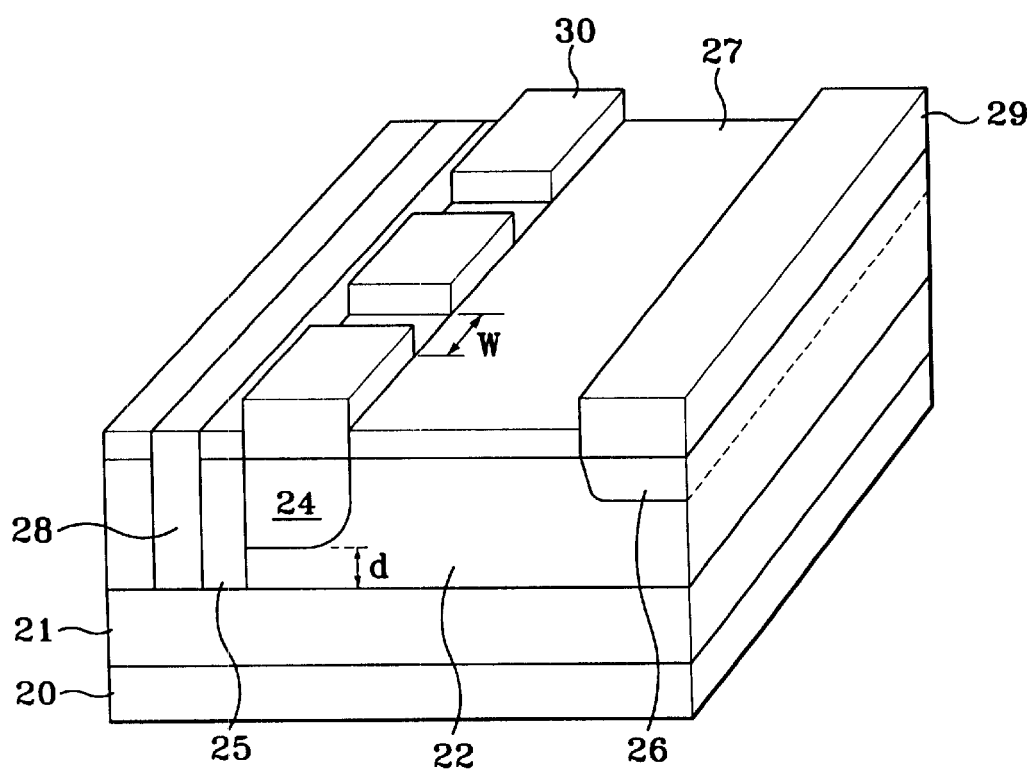
FIG. 2 shows a perspective view of a lateral SOI BMFET according to the present invention.

As shown in FIG. 2, the buried insulation layer 21 is prepared on a semiconductor substrate 20 with P type or N type.

On the buried insulation layer 21, a drift region of N– type, which is epitaxial-grown, is disposed. Among the drift region 22, is disposed a gate region 24 of P+ type at a portion separated from the buried insulation layer 21 by a channel depth "d". The gate region 24 comprises a plurality of cells, each cell separated from adjacent cell by a channel width "W". A N+ source region 25 is contacted with the P+ gate region 24. A N+ drain region 26 opposite to the source region 25 is prepared separately from the P+ gate region 24. On the gate region 24, the source region 25 and the drain region 26 are disposed a gate electrode 30, a source electrode 28 and a drain electrode 29, respectively.

In the normally-off of the lateral SOI BMFET, under the zero voltage of gate-source, a built-in voltage of the junction between P+ gate region 24 and N–drift region 22 thereunder can deplete the channel region with width "d" or the drift region 22 and also create a potential barrier into the channel. Accordingly, though high voltage is applied, it is prevented that a large electron emission from the source region 25 to the drain region 26. That is, the lateral SOI BMFET performs an unipolar operation having a fast turn-off speed like a junction field effect transistor(JFET) with no junction in the current path. In the normally-on of the lateral SOI BMFET, when the gate-source voltage is positive, the P/N junction between the N+ source region 25 and the P+ gate region 24 is under the forward bias. Accordingly, the holes from the P+ gate region are injected to the drift region of epitaxial layer and the channel region, and thus the conductivity modulation of the drift region and the channel region occurs. As a result, the high current can be achieved with low saturation voltage. That is, the lateral SOI BMFET operates a bipolar FET and improves the current capability. In addition, since the gate region has a plurality of cells extended as shown in FIG. 2, the effective channel region of the lateral SOI BMFET is increased. If the effective channel region is increased, the drain current path also is increased, the current level is elevated, and thus the current gain is enhanced.

On the other hand, for a normally-on device, an additional circuit is required in order to block each conventional SOI BMFET. However, each lateral SOI BMFET can be blocked by applying a zero voltage to the gate electrode 30, adjusting the channel width "W" and thus forming a potential barrier higher than that of channel depth "d". Therefore, the high density of the power IC device can be achieved.

Figure 3:
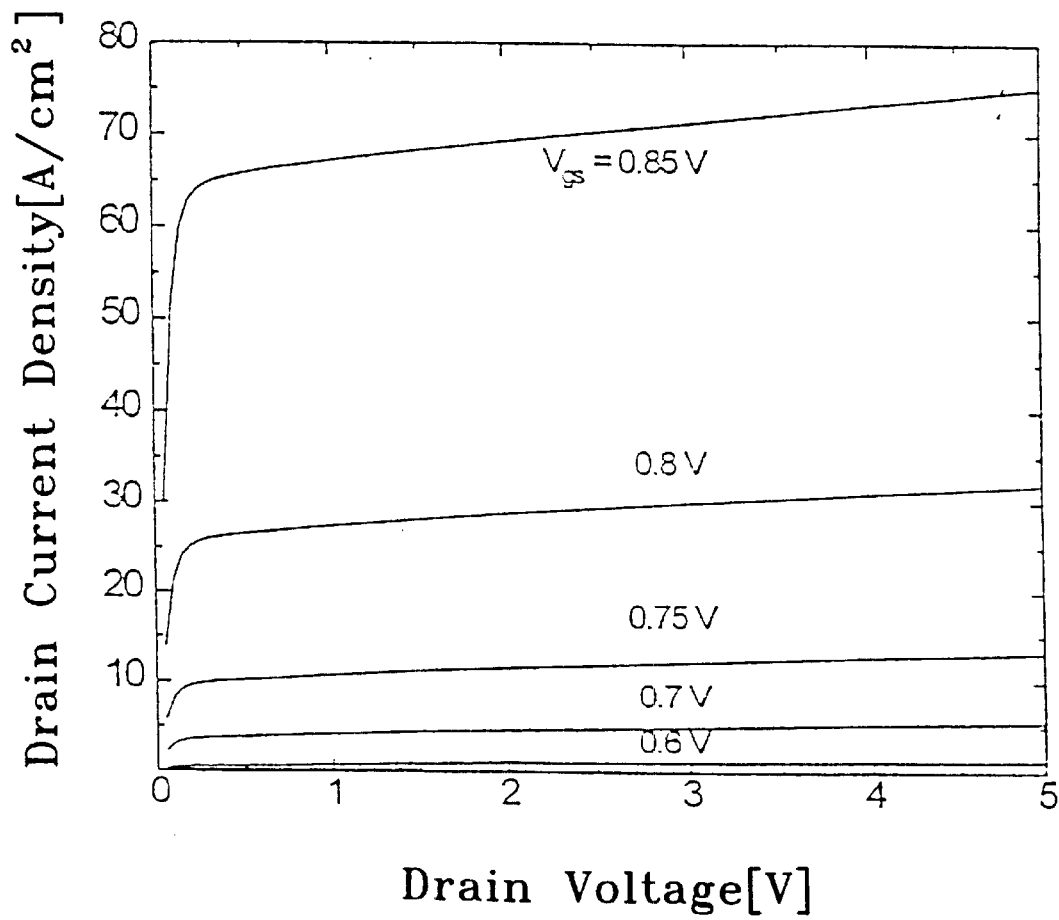
FIG. 3 shows a graph illustrating I–V charactertistic of the lateral SOI BMFET according to the present invention.

FIG. 3 is a graph demonstrating a turn-on characteristic of the SOI BMFET with 1 μm channel depth, which is the forward current feature simulated in two dimension. The vertical axis represents the drain current density and the horizontal axis stands for the drain voltage. We can recognize that in the range of 0.6V to 0.85V of the gate-source voltage, the saturation voltage is low, about 0.1V. The shorter the channel depth "d" is and the larger the channel width "w" is, the less the saturation voltage is. Therefore, the lateral SOI BMFET having the gate region with a plurality of cells extended in three dimension, as shown in FIG. 2, can further improves the current capability by adjusting both the channel depth "d" and the channel width "w".

Figure 4:
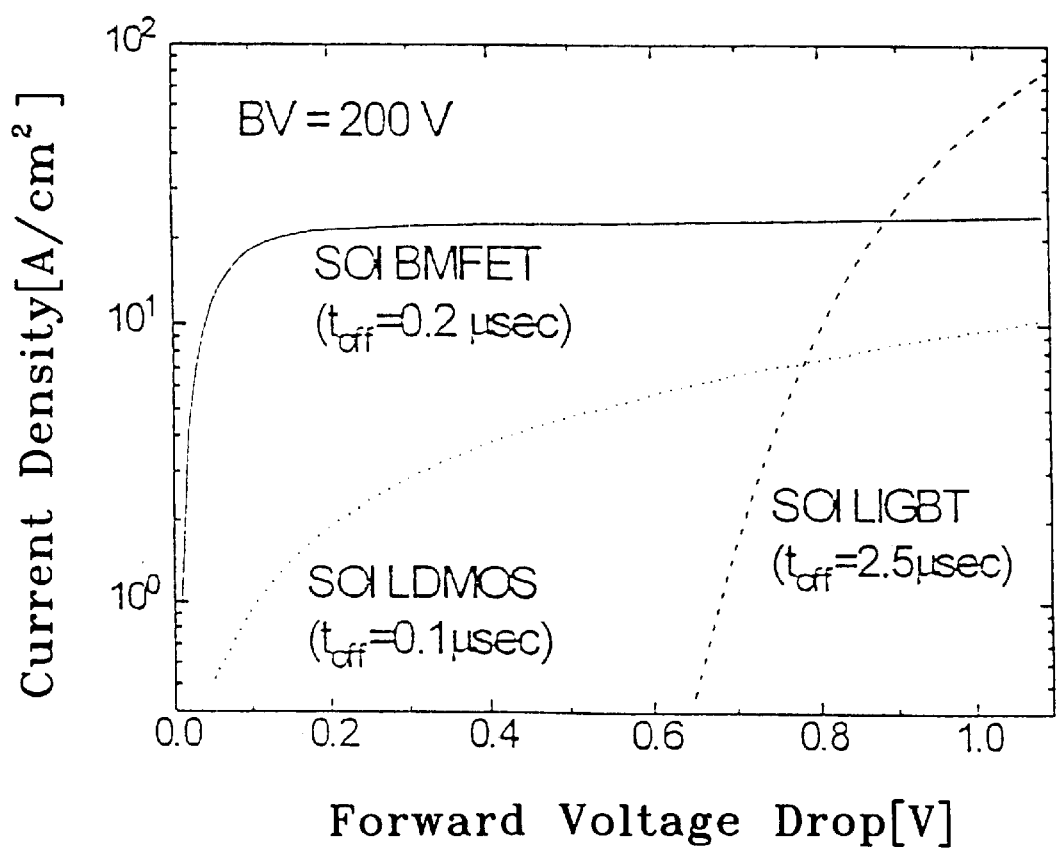
FIG. 4 shows a graph comparing a turn-off characteristic between the lateral SOI BMFET of the present invention and the conventional lateral power devices.

FIG. 4 is a simulated graph of the turn-off time on the present lateral SOI BMFET and the MOS gate power devices at initial current density of 20 A/cm$^2$. The turn-off times of the lateral SOI BMFET, SOI LDMOS and SOI LIGBT are respectively, 0.2 μs, 0.1 μs, and 2.5 μs. Though the turn-off time of the SOI LDMOS is faster than the SOI BMFET, the current leakage goes on after the turn-off while in the lateral SOI BMFET current tail is almost not appeared after the turn-off. In brief, the present lateral SOI BMFET has a low saturation voltage and a low on-resistance in turn-on mode and further, in turn-off mode very slow increase of current density in accordance with the forward voltage drop, thereby improving the voltage blocking capability and the switching speed. Also, by the buried insulation layer is blocked the parasitic BJT current path which is commonly formed in case of forming the BMFET on the epitaxial substrate, so the leakage current does not appear.

FIG. 4 shows a simulated result of the SOI BMFET with the two dimensional gate region. Thus, the SOI BMFET with three dimension gate region as shown in FIG. 2, has a further improved turn-off feature and the forward current characteristic by adjusting the channel width, comparing the SOI BMFET with the two dimensional gate region.

Figure 5A:
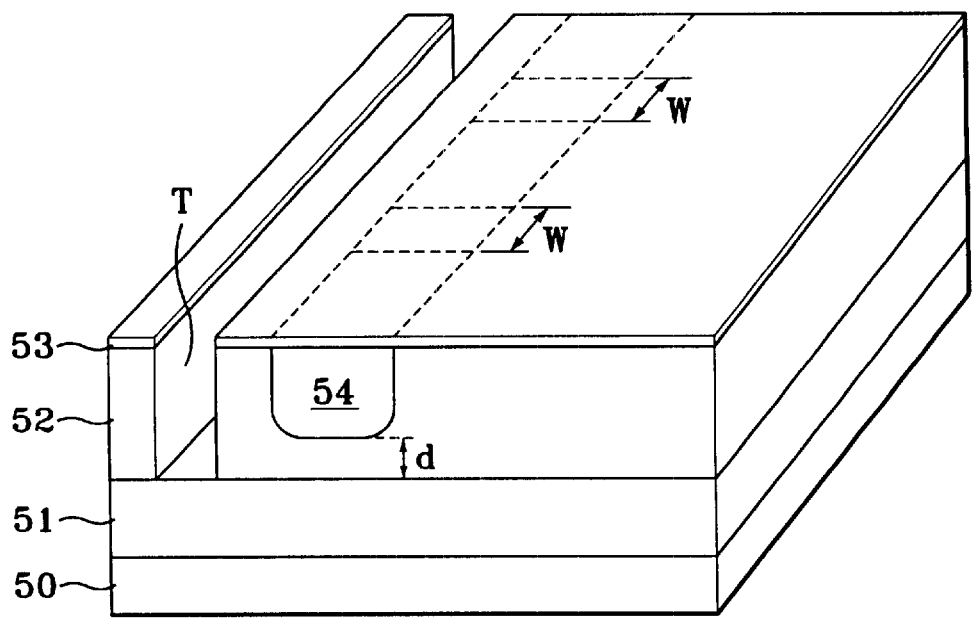
FIGS. 5A to 5C show manufacturing cross-sections of the lateral SOI BMFET of the present invention.
Figure 5B:
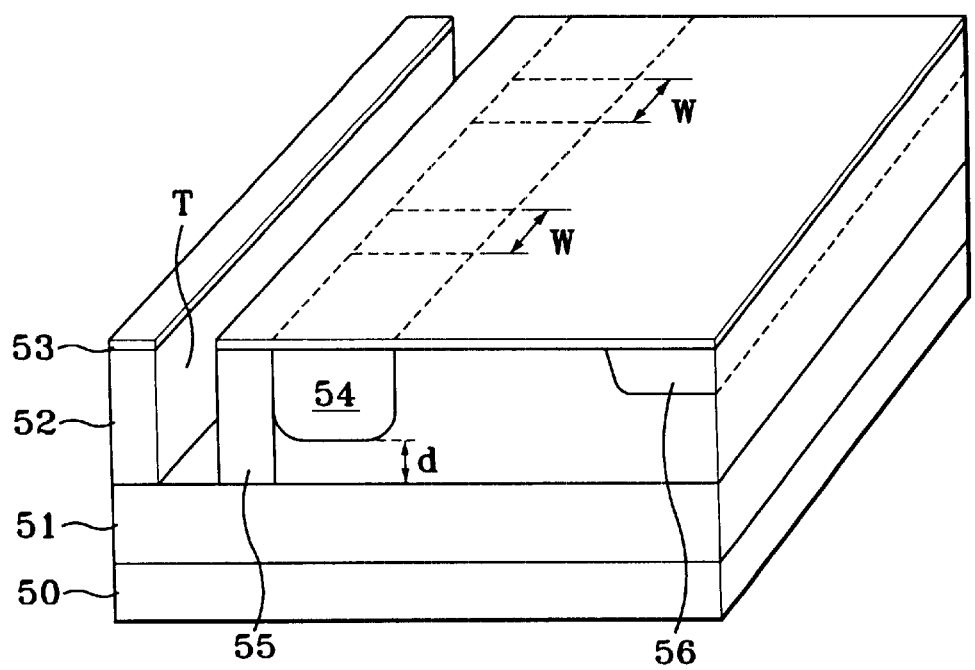
Figure 5C:
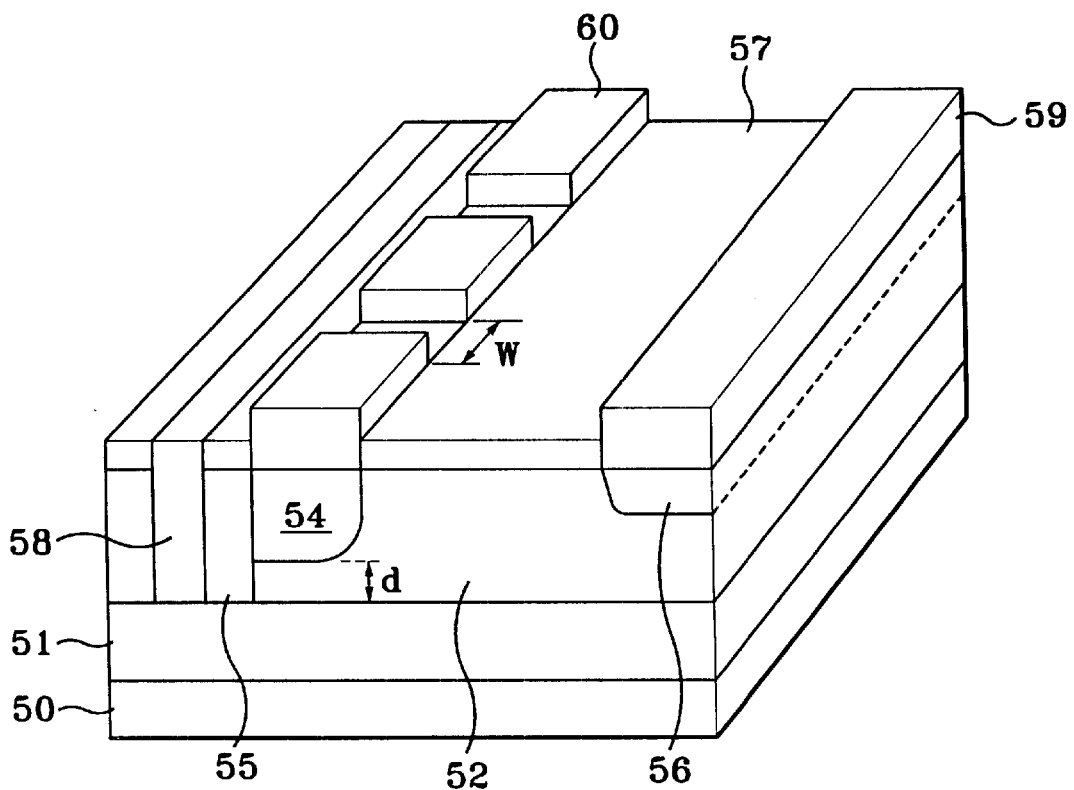

FIGS. 5A to 5C show a manufacturing process of the present lateral SOI BMFET. In FIG. 5A, a N– drift region 52 epitaxial-grown and an oxide layer 53 are sequentially formed on a buried insulation layer 51 on a semiconductor substrate 50 of N type or P type. Thereafter, a trench T is formed within the drift region 52 through a photo lithography process. A P+ gate region 54 is formed at a portion separated from the trench T by a selected distance. The gate region 54 is formed over the buried insulation layer 51 by a channel depth "d" and has a plurality of cells each separated by the channel width "w". The plurality of cells are arranged parallel to the trench T.

In FIG. 5B, between the trench T and the gate region 54 is formed a N+ source region 55. The source region 55 contacts with the gate region 54. At the same time of forming the source region 55, a N+ drain region 56 opposite to the source region 55 is formed separately from the gate region 54 by a selected distance. Then annealing is carried out and the impurities of the drift region, the gate region, the source region and the drain region are diffused.

In FIG. 5C, an insulation layer 57 is coated on the resultant and thereafter, together with the oxide layer 53, removed at a portion within the trench and over the drain region and the gate region. A source electrode 58 is formed by filling the trench with metal and a gate electrode 60 and the drain electrode 59 are formed on the gate region 54 and the drain region 56. The gate electrode comprises a plurality of cell electrodes each separated by the channel width "W".

The lateral SOI BMFET of the present invention is very useful power IC device for high-frequency and high-voltage applications and has a very low forward voltage drop and a high switching, compared with the conventional MOS gate lateral power device. The larger current gain and current capability are obtained by the gate region with a plurality of cells. Also, the turn on/off feature of the SOI BMFET can be controlled by adjusting both the channel depth under the gate region and the channel width.

While the present invention has been particularly shown and described with reference to particular embodiments thereof, it will be understood by those skilled in the art that various changes in form and details may be effected therein without departing from the spirit and scope of the prevent invention as defined by the appended claims.

What is claimed is:

1. A method for manufacturing a lateral bipolar mode field effect transistor, comprising the steps of:

forming a buried insulation layer on a substrate;

forming a drift region having a first conductivity on said buried insulation layer;

forming a trench in said drift region over a part of said buried insulation layer, exposing said part of said buried insulation layer;

forming a gate region having a second conductivity and separated from said buried insulation layer by a first distance, said gate region being formed in a portion of said drift region and separated from said trench;

forming a source region having the first conductivity and located between said gate region and said trench, said source region extending in a first direction, said gate region including a plurality of cells arranged in a second direction substantially parallel to said first direction, and each of said cells being separated from an adjacent one of said cells by a second distance; and forming a drain region having the first conductivity and located opposite to said source region, said drain region being separated from said gate region by a selected distance.

2. The method in claim 1, wherein said first distance is a channel depth and said second distance is a channel width.

3. The method in claim 1, wherein said substrate has an N type.

4. The method in claim 1, wherein said first conductivity is N type and said second conductivity is P type.

5. The method in claim 1, further comprising the steps of:

forming an insulation layer on a resultant in which said source region and said drain region are formed;

removing portions of said insulation layer positioned within said trench and on said gate region and said drain region, respectively;

forming a source electrode by filling said trench with a metallic material; and forming a gate electrode and a drain electrode on said gate region and said drain region, respectively.

6. A method for manufacturing a lateral bipolar mode field effect transistor, comprising the steps of:

forming a buried insulation layer on a substrate;

forming an N− drift region on said buried insulation layer;

forming a trench in said drift region over a part of said buried insulation layer, exposing said part of said buried insulation layer;

forming a P+ gate region separated from said buried insulation layer by a first distance, said gate region being formed in a portion of said drift region and separated from said trench;

forming an N+ source region between said gate region and said trench, said source region extending in a first direction, said gate region including a plurality of cells arranged in a second direction substantially parallel to said first direction, and each of said cells being separated from an adjacent one of said cells by a second distance;

forming an N+ drain region opposite to said source region, said drain region being separated from said gate region by a selected distance;

forming an insulation layer on a resultant in which said source region and said drain region are formed;

removing portions of said insulation layer positioned within said trench and on said gate region and said drain region, respectively;

forming a source electrode by filling said trench with a metallic material; and forming a gate electrode and a drain electrode on said gate region and said drain region, respectively.

7. The method in claim 6, wherein said first distance is a channel depth and said second distance is a channel width.

8. The method in claim 6, wherein said substrate has an N type.

9. The method in claim 1, wherein said substrate has a P type.

10. The method in claim 1, wherein said source region and said drain region are formed simultaneously.

11. The method in claim 1, further comprising the step of forming a source electrode in said trench.

12. The method in claim 1, wherein said source region is in contact with said gate region so as to form a junction with said gate region.

13. The method in claim 6, wherein said substrate has a P type.

14. The method in claim 6, wherein said source region and said drain region are formed simultaneously.

15. The method in claim 6, wherein said source region is in contact with said gate region so as to form a junction with said gate region.

* * * * *